United States Patent [19]
De Palma et al.

[11] Patent Number: 5,208,495
[45] Date of Patent: May 4, 1993

[54] STATIC POWER SWITCH INCORPORATING SEMI-CONDUCTOR

[75] Inventors: Jian Franco De Palma, Chateauneuf par Chamoux aur Gelon; Jean-Jacques Rousseau, Saint-Etienne; Pierre Epron, Lyons, all of France

[73] Assignee: Ferraz, Lyons, France

[21] Appl. No.: 814,492

[22] Filed: Dec. 30, 1991

[51] Int. Cl.$^5$ .................... H03K 17/72; H03K 17/51
[52] U.S. Cl. .................................. 307/640; 307/633; 307/645; 363/57
[58] Field of Search ............... 307/633, 640, 642, 645, 307/542; 363/57, 58, 69, 70

[56] References Cited

U.S. PATENT DOCUMENTS

| 4,231,083 | 10/1980 | Matsuda et al. | 363/57 |
| 4,926,306 | 5/1990 | Ueda et al. | 363/58 |
| 5,051,603 | 9/1991 | Walker | 307/633 |

FOREIGN PATENT DOCUMENTS

| 0100817 | 5/1988 | Japan | 307/633 |
| 1-251917 | 10/1989 | Japan . | |

Primary Examiner—William L. Sikes
Assistant Examiner—Toan Tran
Attorney, Agent, or Firm—Dowell & Dowell

[57] ABSTRACT

A static switch is disclosed, adapted to switch overintensities of more than a thousand amps. Instead of using one large, commercially available component, a series of small components are used in parallel, each being associated with a snubber circuit.

2 Claims, 2 Drawing Sheets

STATIC POWER SWITCH INCORPORATING SEMI-CONDUCTOR

BACKGROUND OF THE INVENTION

1. Field of the Invention

The present invention relates to a static power switch incorporating semi-conductors.

2. History of the Related Art

FIG. 1 of the accompanying drawings schematically shows in much simplified manner a unidirectional static circuit breaker of the prior art. In this example, the load 1 is supplied by a D.C. voltage source 2 and the load is connected in series with a power switch 3 of "GTO" type (i.e. blockable by the gate).

A current sensor 4 applies an image signal of the line current on an input 5 for tipping the control circuit 6 of the thyristor 3. In the event of accidental overintensity, the tipping threshold of the circuit 6 is exceeded and the circuit controls, by the gate 7, the extinction of the thyristor 3, which cuts the supply to the load 1.

The static switch constituted by the thyristor 3 can, however, in theory and in practice, not operate without there being provided at its terminals a switching aid circuit 8, more commonly known as a "snubber" circuit, whose essential role is to limit the rise in the voltage at its terminals at the moment of opening of switch 3.

This snubber circuit 8, which conventionally includes a capacitor 9 placed in series with a discharging resistor 10 shunted by a diode 11. The snubber circuit operates in the following manner:

Upon opening of the switch 3, the self-inductance of the load 1 naturally opposes the decline in the line current which circulates in the load. At first approximation, the current therefore remains constant immediately after opening, while, in the absence of a snubber circuit, the voltage at the terminals of the switch 3 (which was zero before the opening) undergoes a sudden increase, causing at the terminals of the switch an excess voltage which is generally prohibitive and destructive.

The snubber circuit 8 being present, a capacitor 9 is connected to the terminals of the switch 3, with the capacitor's load being zero as long as the switch is closed.

Upon opening, the line current remains, as mentioned above, virtually constant. As the current in the switch 3 undergoes an approximately linear decline, it follows that the charging current of the capacitor 9 undergoes the reverse linear law, with the result that the voltage at its terminals (and consequently the voltage at the terminals of the switch 3), which follows a law of increase which is the integral of the latter linear law of variation of the current, finally varies in accordance with a parabolic law. This voltage therefore rises very slowly, with the result that the losses upon opening in the thyristor 3 are acceptable.

The role of resistor 10 is obviously to limit the intensity of the discharging current of the capacitor 9 upon closure of the switch 3, while diode 11 naturally shunts the resistor upon charging at opening.

In the case of high-power circuits, for instance when the maximum overintensity admissible in the load is for example of the order of 800 amps, the thyristor 3 is conventionally chosen accordingly from those normally available on the market. This results in a remarkably high cost and space requirement.

If it is now desired to be able to switch an accidental overintensity of, for example, 1200 amps, two large thyristors of the above type will conventionally be used, which will then be wired in parallel, with one snubber circuit per thyristor. The drawbacks of high cost and space requirement therefore remain.

SUMMARY OF THE INVENTION

It is an object of the present invention to overcome these drawbacks and the invention relates, to that end, to a static power switch incorporating semi-conductors, adapted to switch overintensities of the order of at least several hundreds of amps to more than a thousand amps, characterized in that the switch includes a large number of small static switches of small dimensions and cut-off characteristics connected in parallel, and a plurality of switching aid or "snubber" circuits, each adapted to protect either one or two of the small switches. Each of the small static switches is chosen from those which are given by a manufacturer for a cut-off overintensity lower than the overintensity that the small switch must, for its part, normally cut in the assembly, in the event of current overload, taking into account its connection in parallel with the other small switches.

BRIEF DESCRIPTION OF THE DRAWINGS

The invention will be more readily understood on reading the following description with reference to the accompanying drawings, in which.

DESCRIPTION OF THE PREFERRED EMBODIMENT

Figure 1:
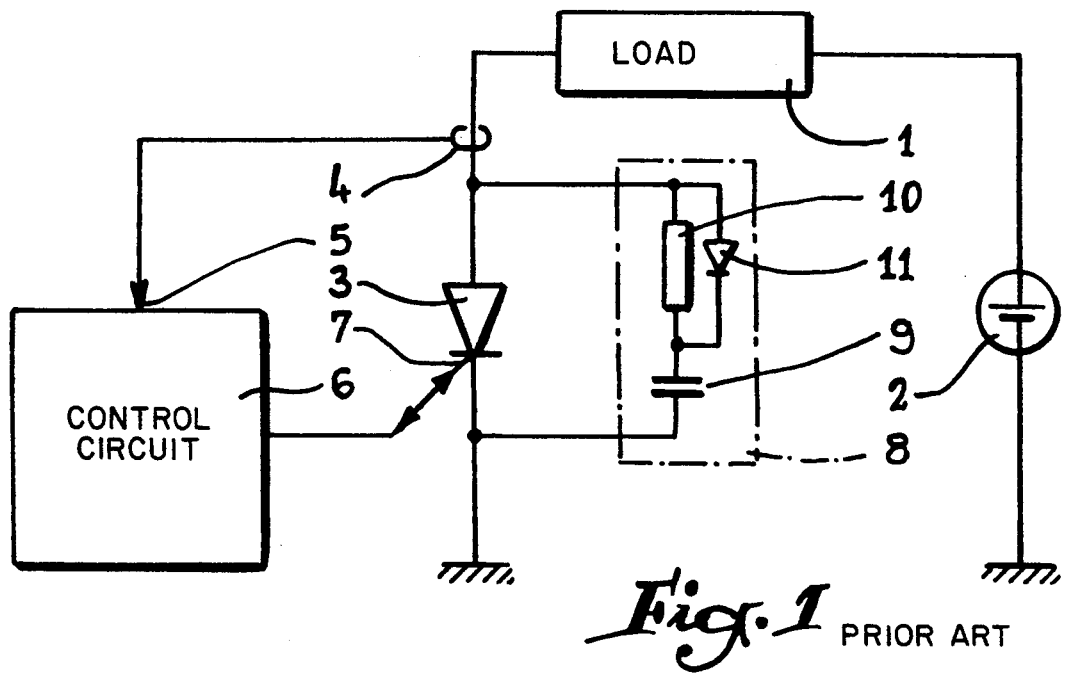
FIG. 1 shows a state of the art circuit as indicated hereinbefore.

Referring now to the drawings, the invention involves producing a static switch for very strong currents, of by replacing the commercially available static switch 3 (FIG. 1) by a large number of small static switches, each adapted to switch an overintensity much lower than that for which the conventional switch 3 of the prior art is provided. The small switches are connected in parallel.

However, the simple application of this idea would lead to an assembly incapable of operating in this particular technique of switching very strong currents.

Figure 2:
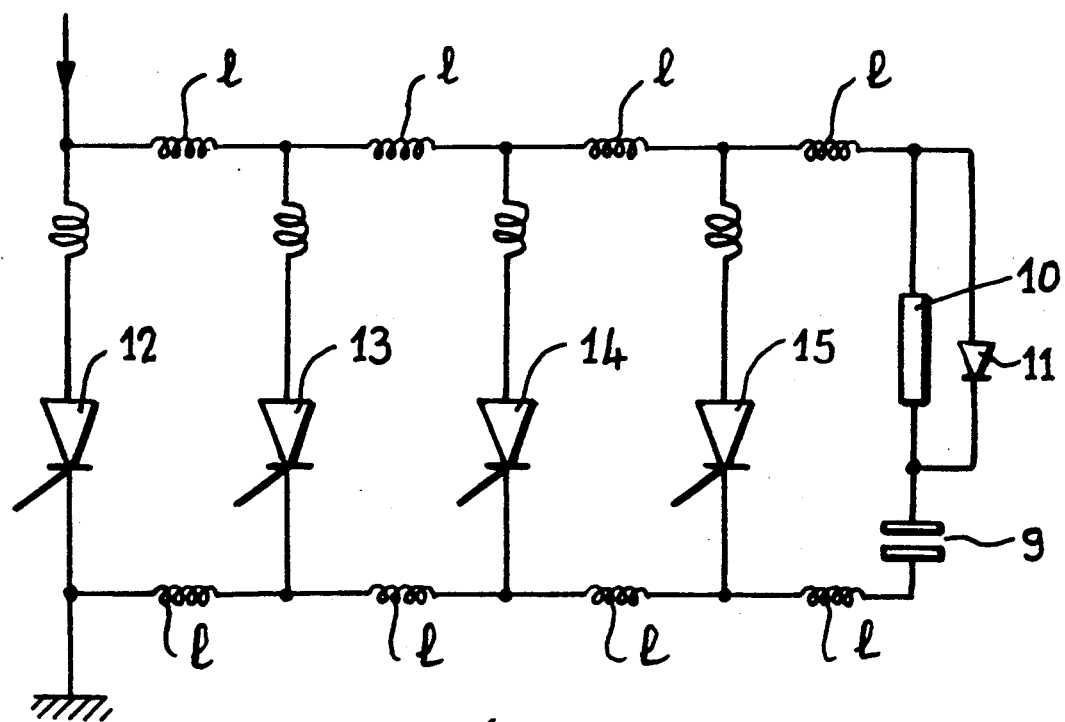
FIG. 2 is a diagram of the general concept of the present invention.

This impossibility is demonstrated in FIG. 2, which shows what the assembly in parallel of a large number (supposed here to be equal to four for clarity of the drawing) of these components, would be in practice.

This assembly, which is the one coming naturally to mind, is composed of a plurality of thyristors 12, 13, 14, 15 in parallel, and of a snubber circuit 8 in parallel in the assembly. However, taking into account the very strong currents to be switched and the very short times for switching these currents, it is in fact not possible to dispense with the self-inductances 1 of the connections between thyristors 12, 13, 14, 15 and between the last thyristor 15 and the common snubber circuit 8 as well as the self-inductances of the components.

With reference to FIG. 1, it has been seen hereinabove that the role of the capacitor 9 of the snubber circuit is to oppose the sudden rise of the voltage in the static switch that it is protecting, during opening of the switch. However, by reason of the considerable variations of current in each self-inductance 1, these latter create an excess voltage, with the result that, although the snubber circuit 8 remains efficient for protecting the closest thyristor 15, it is much less so for protecting thyristor 14 and even less so for protecting thyristor 13, etc . . . , the self-inductances 1 adding their effect of excess voltage as one moves away from the snubber circuit 8. In this type of application, the placing of these multiple thyristors 12 to 15 in parallel can, a priori, therefore not function.

According to the invention, such a placing of a series of small static switches in parallel to replace one or two large static switches available on the market, is, however, possible because of the particular assembly which will now be explained with reference to FIG. 3.

Figure 3:
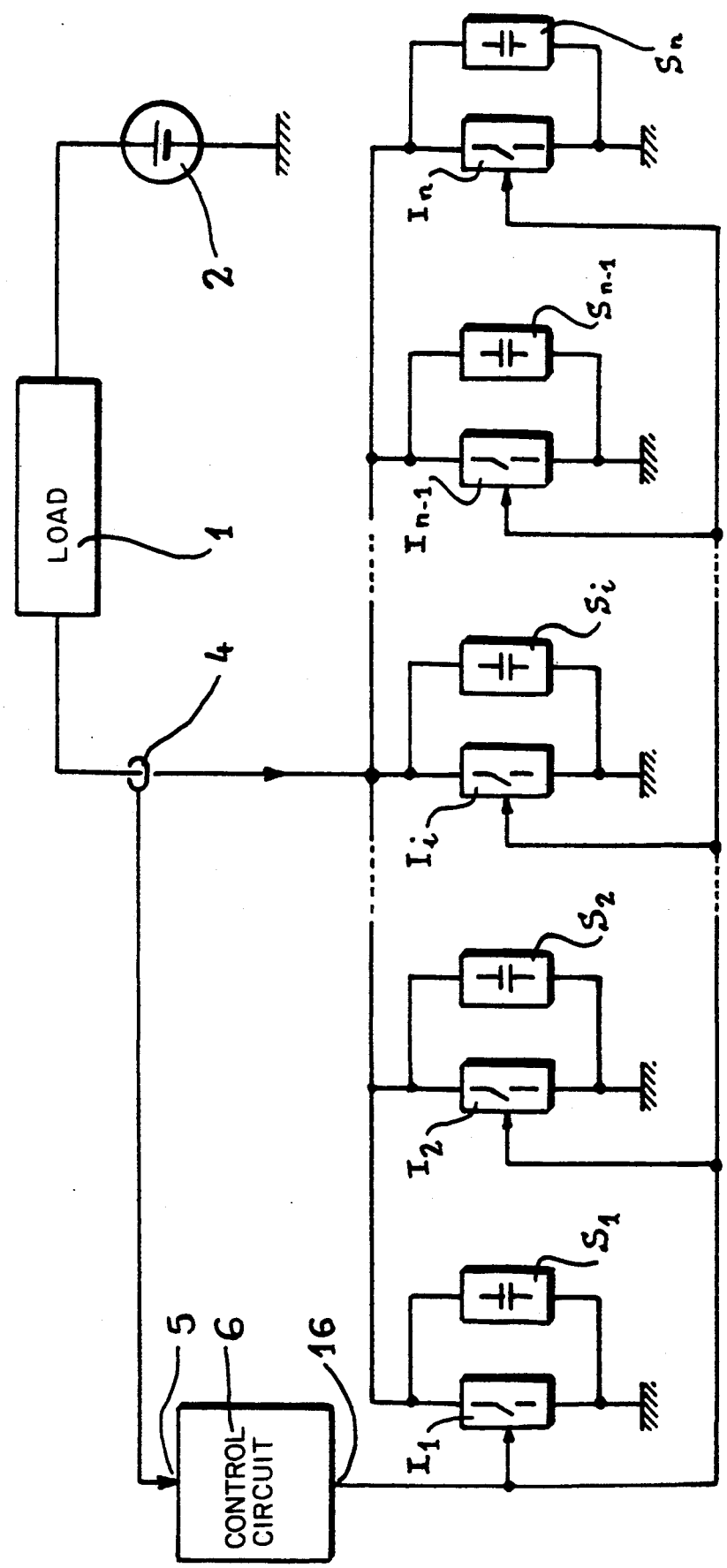
FIG. 3 is a block diagram of the static switch of the present invention.

FIG. 3 therefore shows a static switch intended to cut a very high overintensity, for example 1200 amps, it being understood that such a switch could very well be produced, with the drawbacks set forth hereinabove, by applying the diagram of FIG. 1 and using one or two large thyristors 3 available on the market, and associating a snubber circuit 8 with each thyristor 3.

In FIG. 3, elements 1, 2, 4, 5, 6 which are either identical or similar to those of FIG. 1, bear the same reference numerals to allow easy comparison.

According to the invention, the GTO thyristor 3 and its snubber circuit 8 are here replaced:

—thyristor 3, by n "small" GTO thyristors $I_1, I_2 \ldots, I_i \ldots, I_{n-1}, I_n$, which are connected in parallel as shown. In this particular example, n is chosen to be equal to 12. All these thyristors are triggered off in parallel and simultaneously on their gate by the output 16 of the threshold control circuit 6: consequently, the connections between the output 16 and each gate are all of strictly equal length.

—snubber circuit 8, by (n) snubber circuits $S_1, S_2, S_i \ldots, S_{n-1}, S_n$, which are themselves connected in parallel on all the thyristors $I_1$ to $I_n$, but in this case which are each placed between two thyristors so as to produce an alternate succession of thyristors and snubber circuits: thyristor $I_1$, snubber circuit $S_1$, thyristor $I_2$, snubber circuit $S_2 \ldots$, thyristor $I_i$, snubber circuit $S_i \ldots$, thyristor $I_{n-1}$, snubber circuit $S_{n-1}$, thyristor $I_n$, snubber circuit $S_n$. Of course, the connections between each snubber ($S_1$ for example) and the thyristor ($I_1$) associated therewith, are the shortest possible in order to reduce to a maximum the parasitic self-inductances 1 mentioned hereinbefore (cf. FIG. 2).

According to an advantageous feature, the twelve GTO thyristors $I_1$ to $I_n$, which must therefore each be able to cut an overintensity of 100 amps, are chosen from commercially available thyristors which are given for a much lower "maximum" overintensity or "$I_{TCM}$" (maximum current that it is possible to cut by the gate). For example, GTO thyristors marketed by the firm MOTOROLA under reference "MGTO 1200", which are given for an $I_{TCM}$ of 50 amps. The present inventors have in fact realized that, contrary to what might be expected from the manufacturer's data, such thyristors were perfectly suitable for the present use.

For example, switches $I_1$ to $I_n$ may be controllable components other than GTO thyristors, such as IGBT transistors, bipolar transistors, field effect transistors, etc. The assembly of FIG. 3 may also be simplified by associating with two thyristors one snubber circuit of which the capacitance of the capacitor is calculated accordingly. In other words, it is also possible to produce an elementary switching cell by associating one snubber circuit with two small switches, each of the two small switches being positioned on either side of the snubber circuit: the static circuit breaker adapted to switch the high overintensities is then produced at least partially by a juxtaposition (by placing in parallel) of these elementary cells. The connections between the snubber circuit and the two thyristors which surround it are always the shortest possible, as mentioned hereinbefore.

What is claimed is:

1. A static power switch incorporating semiconductors, adapted to switch overintensities of a first magnitude in the order of at least several hundred amps, occurring between a source of power supply and a load, wherein the power switch comprises a plurality of small static switches, means for connecting said small static switches in parallel, each of said small static switches having cut-off characteristics which are operable at maximum overintensities ratings, said ratings being less than a theoretical rating determined by dividing the number of small switches into the first magnitude of overintensities so that when added together for each of the small switches connected in parallel the total is less than the first magnitude, a plurality of snubber circuits, and means for connecting a snubber circuit to at least one of the small static switches to protect the small switches.

2. The static power switch of claim 1, wherein elementary switching cells are formed by connecting two of said small switches with each of said snubber circuits, and means for connecting each of said elementary switching cells in parallel.

* * * * *